United States Patent
Nakamura et al.

(10) Patent No.: US 7,851,898 B2
(45) Date of Patent: Dec. 14, 2010

(54) MULTICHIP PACKAGE OR SYSTEM-IN PACKAGE

(75) Inventors: Satoshi Nakamura, Yokohama (JP); Takashi Suga, Yokohama (JP); Mitsuaki Katagiri, Nishitokyo (JP); Yukitoshi Hirose, Chigasaki (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 912 days.

(21) Appl. No.: 11/384,277

(22) Filed: Mar. 21, 2006

(65) Prior Publication Data
US 2006/0227587 A1    Oct. 12, 2006

(30) Foreign Application Priority Data
Mar. 22, 2005    (JP)    ............... 2005-081261

(51) Int. Cl.
*H01L 23/538*    (2006.01)
*H01L 23/52*    (2006.01)
*H01L 25/18*    (2006.01)
*H01L 25/065*    (2006.01)
(52) U.S. Cl. .............. 257/685; 257/686; 257/690; 257/723; 257/773; 257/E21.526; 257/E23.171; 257/E25.013
(58) Field of Classification Search ......... 257/686, 257/777, 685, 690, 723, 773, E21.526, E23.171, 257/E25.013
See application file for complete search history.

(56) References Cited

U.S. PATENT DOCUMENTS

| 4,574,235 | A | * | 3/1986 | Kelly et al. | ............ 324/754 |
| 5,502,333 | A | * | 3/1996 | Bertin et al. | ............ 257/685 |
| 5,798,282 | A | * | 8/1998 | Bertin et al. | ............ 438/15 |
| 5,808,351 | A | * | 9/1998 | Nathan et al. | ............ 257/528 |
| 6,600,222 | B1 | * | 7/2003 | Levardo | ............ 257/686 |
| 6,777,797 | B2 | | 8/2004 | Egawa | |

FOREIGN PATENT DOCUMENTS

| JP | 2000-332192 | 11/2000 |
| JP | 2001-196526 | 7/2001 |
| JP | 2003-158239 | 5/2003 |
| JP | 2004-031754 | 1/2004 |
| JP | 2004-158098 | 6/2004 |

* cited by examiner

*Primary Examiner*—Zandra Smith
*Assistant Examiner*—Tsz K Chiu
(74) *Attorney, Agent, or Firm*—Mattingly & Malur, P.C.

(57) ABSTRACT

Disclosed is a multichip package or system-in package which the logic chip includes a selector circuit which, by transmitting a test mode select signal or a test mode select command to the logic chip, enables access from a logic signal pin connected to the logic chip, to a memory control signal to each of the "m" number of memory chips; and the memory control signal, when viewed from the logic chip, is connected using a one-for-one wiring scheme or a one-for-up-to-m branch wiring scheme, between the selector circuit and each of the "m" number of memory chips. This multichip package or system-in package is low in noise and high in operational reliability.

7 Claims, 7 Drawing Sheets

MULTICHIP PACKAGE OR SYSTEM-IN PACKAGE

BACKGROUND OF THE INVENTION

1. Field of the Invention

The present invention relates to a multichip package or system-in package constructed by mounting, on a package substrate, not only one or more low-power-consumption memory chips for use in hand-held devices, but also a logic chip for controlling the memory chips.

2. Description of the Related Art

Examples of the known multichip packages (MCPs) or system-in packages (SiPs) each constructed by mounting a plurality of low-power-consumption memory chips for a hand-held device, and a logic chip, in stacked or planar form in one package, are disclosed in Japanese Patent Laid-Open Nos. 2004-31754 and 2001-196526. These MCPs/SiPs require operational testing of memory provided therein after the packaging. In order to inherit existing testers and/or test patterns and enable direct access from the outside of the package to the memory, in the current MCPs or SiPs, the data/address/control signals and other signals are leaded out as test-only pins. These test-only pins function as no-contact pins not connected to any section during actual operation.

SUMMARY OF THE INVENTION

In general, the low-power-consumption DRAMs for hand-held devices, used in MCPs or SiPs, have at least 30 to 40 data signal/address signal/control signal lines as memory control signal lines. Accordingly, if these signal lines are all routed (leaded) via test-only pins to the package exterior, sufficient areas cannot be obtained since the presence of the clearances of the signal wiring and the through-holes in the signal lines will form the power supply/GND (grounding) layers of the package substrate into an island shape.

The GND layer is only split into a dedicated section for the logic chip and that of the memory chip(s), and basically, both of the two types of chips usually share the GND layer. For this reason, the above test-only pins do not extremely decrease in the area allocated to the GND layer.

However, there are no logic chips or memory chips employing a single power supply. For example, logic chips employ an independent power supply for IO use and core use each, and these power supplies are further divided according to function. Memory chips also use at least two kinds of power supplies, including at least an IO power supply and a core power supply. For these reasons, the entire MCP/SiP is to have more than 10 kinds of power supplies.

In the MCP/SiP, therefore, many kinds of power supply layers exist and this limits the wiring area that can be allocated to each power supply. Also, the presence of the test-use wiring up to the test-only pins limits the power supply wiring areas to even smaller values, thus increasing the supply voltage noise level of the chip within the package.

In addition, to the data signals, address signals, and command signals exchanged between the logic and memory during actual operation, the wirings routed to the test-only pins appear to be unnecessary stub wirings, so the signals deteriorate in waveform quality.

Because of such increased supply voltage noise levels and deteriorated waveform quality in packaged logic chips and memory chips, multichip packages or system-in packages have the problems of, for example, malfunctions, operational instability, and decreased reliability.

In order to solve the above problems, an object of the present invention is to provide a multichip package or system-in package that features low noise and high operational reliability.

The present invention has various aspects to achieve the above object. Some of the aspects are briefly described below.

One aspect of the present invention is a multichip package or system-in package constructed by mounting, on a package substrate, an "m" number of memory chip(s) ("m" inclusive of one) and a logic chip for controlling the "m"number of memory chip(s). The logic chip includes a selector circuit which, by transmitting a test mode select signal or a test mode select command to the logic chip, enables access from a logic signal pin connected to the logic chip, to a memory control signal to each of the "m" number of memory chip(s). The memory control signal, when viewed from the logic chip, is connected using a one-for-one wiring scheme or a one-for-up-to-m branch wiring scheme, between the selector circuit and each of the "m" number of memory chip(s).

Another aspect of the present invention is a multichip package or system-in package constructed by mounting, on a package substrate, an "m" number of memory chip(s) ("m" inclusive of one) and a logic chip for controlling the "m" number of memory chips. The logic chip includes a test pattern generating circuit that generates a test pattern signal to enable each of the "m" number of memory chips to be tested by transmitting a test mode select signal or a test mode select command to the logic chip, and then transmits the test pattern signal to each of the "m" number of memory chip(s). The test pattern signal, when viewed from the logic chip, is connected using a one-for-one wiring scheme or a one-for-up-to-m branch wiring scheme, between the test pattern generating circuit and each of the "m" number of memory chip(s).

In yet another aspect of the present invention, the above package substrate has at least four wiring layers, and connections based on the one-for-one wiring scheme or the one-for-up-to-m branch wiring scheme include a wire-bonding connection or bump connection, via the wiring formed on a first layer (signal wiring layer) of the package substrate, or on the first layer and a second layer (GND wiring layer) thereof, or include a direct wire-bonding connection or bump connection, between the logic chip and each of the "m" number of memory chip(s).

In a further aspect of the present invention, test-only pins, which are to directly access each of the "m" number of memory chip(s), are removed from the package substrate (so as to not lead out the test-only wiring to outside of the package substrate).

In a further aspect of the present invention, power supply wiring for the logic chip and power supply wiring for an "m" number of memory chip(s) are allocated to either the third layer of the package substrate or the third layer and next lower layer of the package substrate, the allocated power supply wiring for the logic chip supplying electric power thereto by being connected from a power supply pin for the logic chip thereto via the allocated power supply wiring for the logic chip, the allocated power supply wiring for an "m" number of memory chip(s) supplying electric power to each thereof by being connected from power supply pins for each of the "m" number of memory chip(s) to each thereof via the allocated power supply wiring for "m" number of memory chip(s).

In a further aspect of the present invention, an area allocated to the power supply wiring on the package substrate is at least 40% of an area of the package substrate itself or of an area of the GND wiring.

According to the present invention, it is possible to provide a multichip package or system-in package that features low noise and high operational reliability.

BRIEF DESCRIPTION OF THE DRAWINGS

Other objects and advantages of the invention will become apparent from the following description of embodiments with reference to the accompanying drawings in which.

DETAILED DESCRIPTION OF THE PREFERRED EMBODIMENTS

Embodiments of the present invention and advantageous effects of the embodiments will be described in detail below referring to the accompanying drawings. In the description below, constituent elements having the same function in all explanatory diagrams of the embodiments are each assigned the same reference number or symbol, and repeated description of these constituent elements is omitted.

First Embodiment

Figure 1:
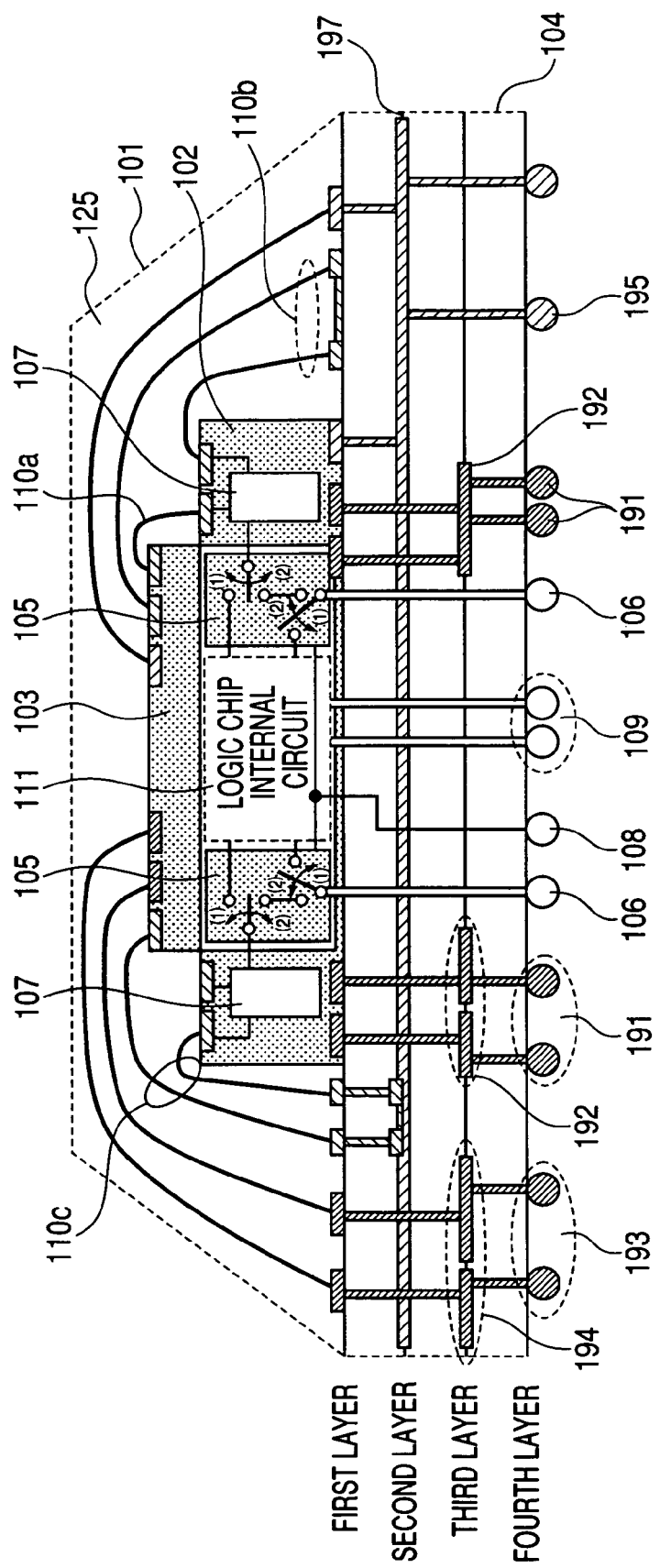
FIG. 1 is a front sectional view showing a first embodiment of an MCP or SiP according to the present invention.

FIG. 1 is a front sectional view of a first embodiment, showing a mounting structure of a typical multichip package or system-in package according to the present invention.

The first embodiment of a multichip package (MCP) or system-in package (SiP) 101 in FIG. 1 includes one logic chip 102, one or more low-power-consumption memory chips 103 for a hand-held device, and a package substrate 104 for mounting the two types of chips. The MCP or SiP 101 is constructed by mounting the logic chip 102 and the memory chip(s) 103 in an electrically connected condition on the package substrate 104 and then sealing both of the two types of chips with a resin 125. The logic chip 102 and the low-power-consumption memory chip(s) 103 may be constructed in stacked or horizontally mounted form on the package substrate 104. For multiple memory chips 103, however, stacked construction is excellent in that there is no need to increase the package substrate 104 in area.

The following description of the present embodiment assumes that the package substrate 104 in the MCP or SiP 101 has wiring layers of a four-layer structure.

Electric power to the logic chip 102 is supplied by using flip chip bumps or wire-bonding connections from bumps on the first layer (signal wiring layer). More specifically, the power is routed from logic chip power supply pins 191 via logic chip power supply wirings 192 allocated to the third layer and/or next lower layer (i.e., the third layer and/or fourth layer) of the package substrate 104, to the bumps on the first layer (signal wiring layer), the above route having via-holes therein. Electric power to the memory chip(s) 103, as with the power to the logic chip 102, is supplied by using flip chip bumps or wire-bonding connections from bumps on the first layer. More specifically, the power is routed from logic chip power supply pins 191 via logic chip power supply wirings 194 allocated to the third layer and/or next lower layer (i.e., in FIG. 1, to the third layer only) of the package substrate 104, to the bumps on the first layer, the above route also having via-holes therein. Not a single kind of power supply is used for the logic chip 102 and the memory chip(s) 103. Since independent power needs to be supplied for each of various functional blocks, namely, a core power supply (i.e. a power supply for the internal circuit), an IO power supply (i.e. a power supply for the IO circuit), a Ref (terminating) power supply, and/or the like, the logic chip 102 and the memory chip(s) 103 are, as shown in FIG. 1, connected to the wiring of the third layer and/or next lower layer, for each of the power supplies. Additionally, a GND layer common to the logic chip 102 and the memory chip(s) 103 is connected from flip chip bumps or wire-bonding connections, via GND wiring 197 formed on, for example, the second layer (GND wiring layer) of the package substrate 104, to GND layers on, for example, a printed-wiring board (not shown) on which the package substrate 104 will be mounted. In FIG. 1, GND is formed as a layer common to the logic chip 102 and memory chip(s) 103 on the package substrate 104. However, there is no problem, even if this GND layer is separated in the package substrate 104.

The logic chip 102 further has a selector circuit 105 in its chip internal circuit 111. For memory testing, the logic chip 102 can use the selector circuit 105 to switch a signal path of a logic signal pin 106 which also functions as a test pin (hereinafter, referred to as the test/logic signal combination pin 106), to a signal path of a memory interface (IF) circuit 107 [that is, path (2) in FIG. 1: a path from the test/logic signal combination pin 106 to a logic chip internal circuit 111, a memory IF circuit 107, and a memory chip (103), in that order). For normal operating conditions, the logic chip 102 can use the selector circuit 105 to switch the above signal path to a signal path of the logic chip internal circuit 111 [that is, path (1) in FIG. 1: a path from the test/logic signal combination pin 106 to the memory IF circuit 107, and then the memory chip (103)]. The above switching operation of the selector circuit 105 is conducted when a mode select signal ("High" or "Low" logical level signal or rising/falling edge signal) is applied from a mode select signal pin 108 or when a test mode command signal is applied to a logic signal pin 109. Thus, the selector circuit 105 conducts signal path control to select either the above path (2) for memory testing, or the above path (1) for normal operating conditions.

Figure 2:
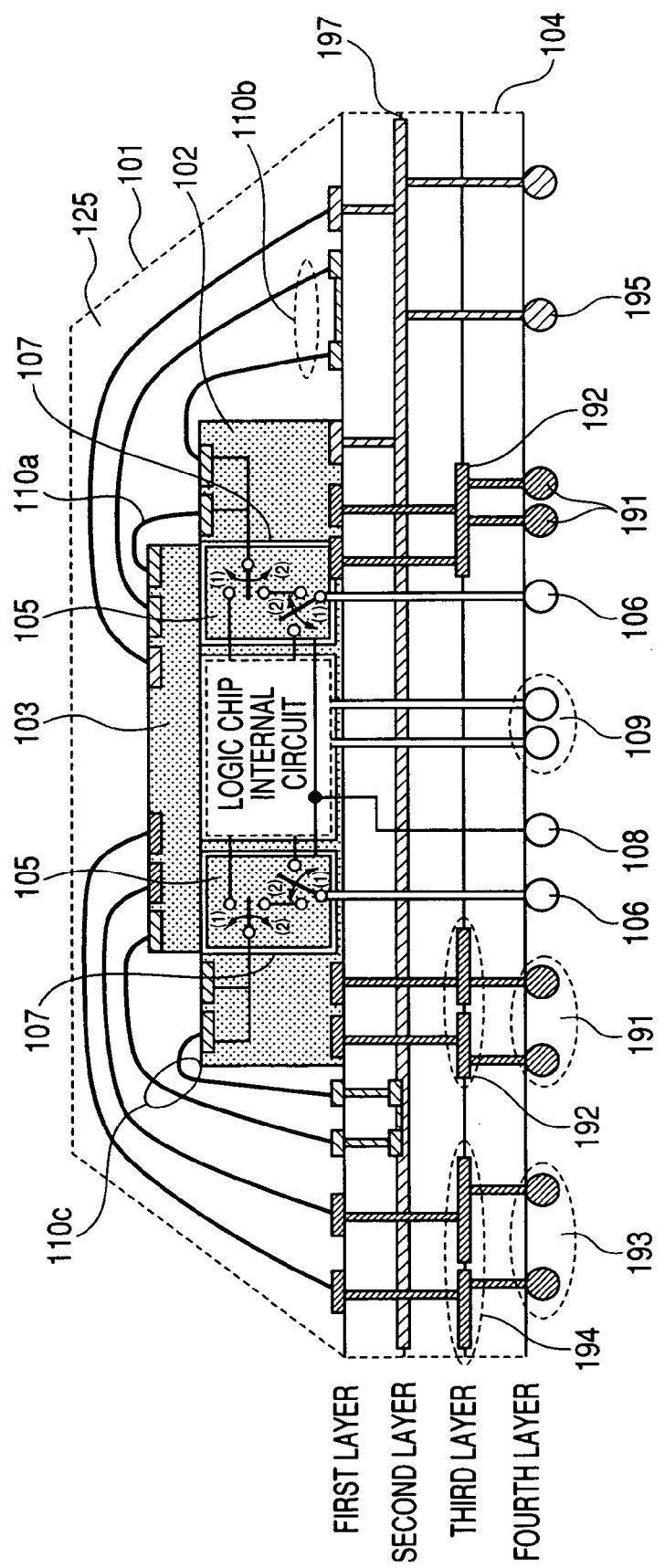
FIG. 2 is a front sectional view showing an MCP or SiP different from that of the first embodiment in FIG. 1.

FIG. 2 shows an example in which the selector circuit in the first embodiment of the MCP or SiP according to the present invention is built into the memory IF circuit. Essentially the same advantageous effects can likewise be obtained by, in this way, as shown in FIG. 2, building the selector circuit 105 into the memory IF circuit 107.

Figure 3:
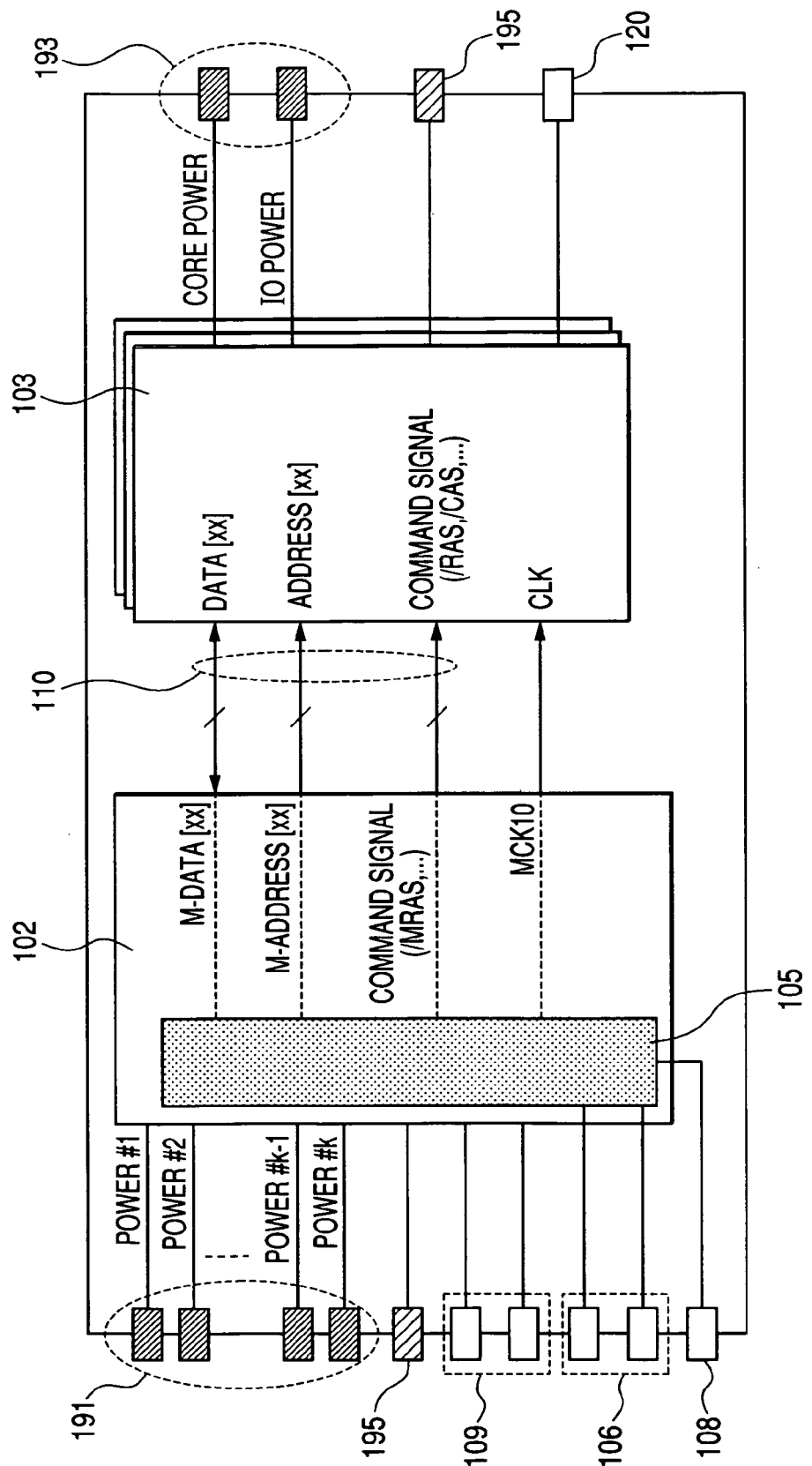
FIG. 3 is a block diagram showing the first embodiment of an MCP or SiP according to the present invention.

FIG. 3 is a block diagram showing the first embodiment of the MCP or SiP according to the present invention. As shown in FIG. 3, power supply signal lines #1 to #n are each routed (leaded) from the logic chip power supply wiring pins 191 provided on the reverse side (termed the fourth layer as a signal wiring layer) of the package substrate 104, via the logic chip power supply wirings 192 allocated to the third layer and/or next lower layer of the package substrate 104, to the bumps on the surface (first layer) of the package substrate 104. Through the above routes that use via-holes, electric power is supplied from independent power supplies via flip chip bumps or wire-bonding connections, for each functional block, to the logic chip 102. GND signal lines from GND pins 195 formed on the reverse side of the package substrate 104 are routed (leaded) through via-holes and GND wiring 197 formed on, for example, the second layer of the package substrate 104, to the bumps on the surface (first layer). The GND pins 195 are thus connected to GND of the logic chip 102 via flip chip bumps or wire-bonding connections. Signals from the logic signal pins 109 each giving a test mode command signal are routed from the reverse side of the package substrate 104 to the surface thereof and connected to the logic chip internal circuit 111. A signal from the test/logic signal combination pin 106 is routed from the reverse side of the package substrate 104 to the surface thereof and input to the selector circuit 105. A signal from the mode select signal pin 108 is routed from the reverse side of the package substrate 104 to the surface thereof and input to the selector circuit 105 via the logic chip internal circuit 111.

Electric power to one or more ("m" number of) memory chip(s) 103 is supplied from power supplies such as the core power supply (the power supply for the internal circuit) and the IO power supply (the power supply for the IO circuit). That is to say, the power is routed (leaded) from memory chip power supply pins 193 provided on the reverse side of the package substrate 104, via memory chip power supply wirings 194 allocated to the third layer and/or next lower layer of the package substrate 104, to the bumps on the surface (first layer) of the package substrate 104. The above routes include via-holes. Electric power is thus supplied in split form for each functional block via wire-bonding connections or the like. The signal lines from the GND pins 195 formed on the reverse side of the package substrate 104 are routed through via-holes first and then the GND wiring 197 formed on, for example, the second layer (GND wiring layer) of the package substrate 104, to the bumps on the surface (first layer). The GND pins 195 are thus connected to GND of each memory chip 103 via wire-bonding connections or the like. A signal from an external input/output pin 120 is routed from the reverse side of the package substrate 104 to the surface thereof and connected to each memory chip 103 via wire-bonding connections or the like.

Additionally, since memory access from the test/logic signal combination pin 106 is possible during the memory tests conducted after the MCP or SiP 101 has been mounted, an "m" number of memory control signal(s) 110 from the logic chip 102 to the "m" number of memory chip(s) 103, such as an address signal, a data signal, and control signals (command signals: /RAS (Row Address Select) and /CAS), need only to be directly connected between the logic chip 102 with the built-in selector circuit 105, and the memory chips 103, via wire-bonding connections or the like. Alternatively, the "m" number of memory control signals 110 need only to be connected using the one-for-up-to-m branch wiring scheme, only via the first layer of the package substrate 104 or the first layer and second layer thereof, by means of wire bonding or the like. Using these connection configurations makes it unnecessary to provide a test-only pin for memory access from the reverse side of the package substrate 104, thus making it possible to ensure an area wide enough to allocate large quantities of power supply wirings for the logic chip and the memory chips to the third layer and/or next lower layer of the package substrate 104.

In FIGS. 2 and 3, the same reference numbers or symbols as used in FIG. 1 signify the blocks having the same function.

In the first embodiment of the present invention, during the memory tests conducted after the MCP or SiP 101 has been mounted, memory access from the test/logic signal combination pin 106 is possible and there is no need to form a route to a test-only pin. This is why the memory control signals 110 to the memory chips 103, such as the address signal, the data signal, and the control signals (command signals: /RAS (Row Address Select) and /CAS), need only to be either directly connected between the logic chip 102 with the built-in selector circuit 105, and the memory chips 103, or via the wiring formed only on the first layer of the package substrate 104, or on the first layer and second layer (lower layer) thereof. Accordingly, if the MCP or SiP 101 includes one logic chip 102 and one memory chip 103, when the memory chip 103 is viewed from the logic chip 102, the memory control signals 110 take a one-for-one connection configuration free of branch wiring. If the MCP or SiP 101 includes one logic chip 102 and an "m" number of memory chip(s) 103, when the memory chip(s) 103 are viewed from the logic chip 102, the memory control signals 110 take a connection configuration based on a one-for-up-to-m branch wiring scheme. If a GND signal is included in the memory control signals 110, these signals take a connection configuration based on the one-for-m or one-for-up-to-m branch wiring scheme. The memory control signal connection between the logic chip 102 and the memory chips 103, based on the one-for-up-to-m or branch wiring scheme, becomes the direct connection (110*a*) established by wire bonding between the logic chip 102 and the memory chips 103, and/or the wire-bonding connection or bump connection (110*b*, 110*c*) established via the wiring formed only on the first layer of the package substrate 104 or on the first layer and the second layer (the wiring here may include one close to bumps). If, as denoted by 110*c*, the connection is via the wiring formed on the second layer (GND wiring layer) of the package substrate 104, since the connection cannot be directly made from the memory chip 103 to the second layer, the connection is to be made to the second layer via the wiring formed on the first layer (the wiring here includes one close to bumps), and then through via-holes.

That is to say, as shown in FIGS. 1 and 2, connection of the memory control signals 110 between the logic chip 102 and the memory chips 103 by using the one-for-m or one-for-up-to-m branch wiring scheme is conducted by wire-bonding connection or bump connection 110*b*, 110*c* via the wiring formed only on the first layer (signal wiring layer) of the package substrate 104 or on the first layer (signal wiring layer) and the second layer (GND wiring layer). Alternatively/additionally, the above connection of the memory control signals 110 is conducted by direct wire-bonding connection or bump connection 110*a* between the logic chip 102 and the memory chips 103.

As a result, it becomes unnecessary that test-only pins for accessing a memory be routed from the surface of the package substrate 104 to the reverse side thereof. Therefore, area in which the various power supply wirings for the logic chip and the memory chips can be allocated on the third layer and/or next lower layer of the package substrate 104, is extended. Such extension, in turn, allows a necessary power supply wiring area to be obtained and substantially reduces supply voltage noise levels of the chips within the MCP or SiP 101. In addition, test-only pin wiring which, to the memory control signals between the logic chip and the memory chips during actual operation, appears as if the wiring were unnecessary stub wiring, becomes unnecessary and deterioration of the memory control signals in waveform quality can be prevented. This makes it possible to realize an MCP or SiP that features low noise and high operational reliability.

Second Embodiment

Figure 4:
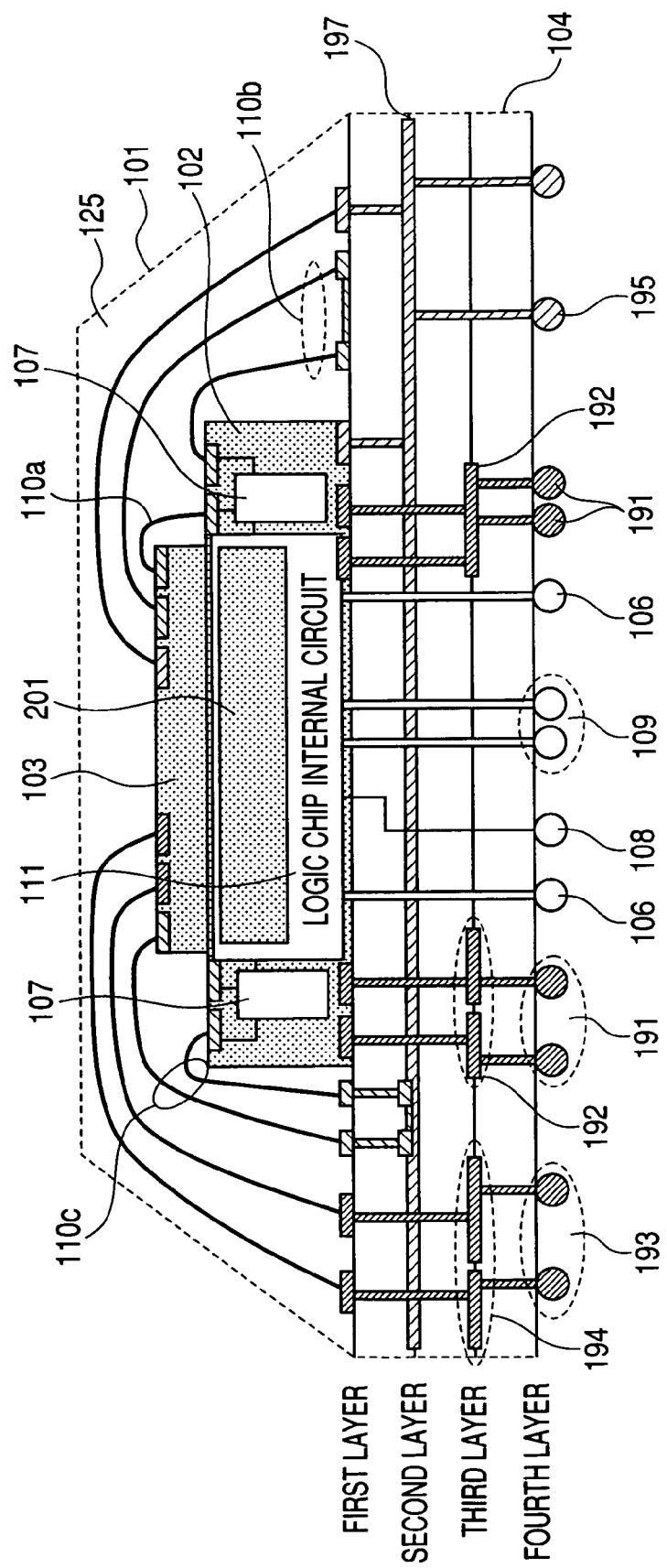
FIG. 4 is a front sectional view showing a second embodiment of an MCP or SiP according to the present invention.
Figure 5:
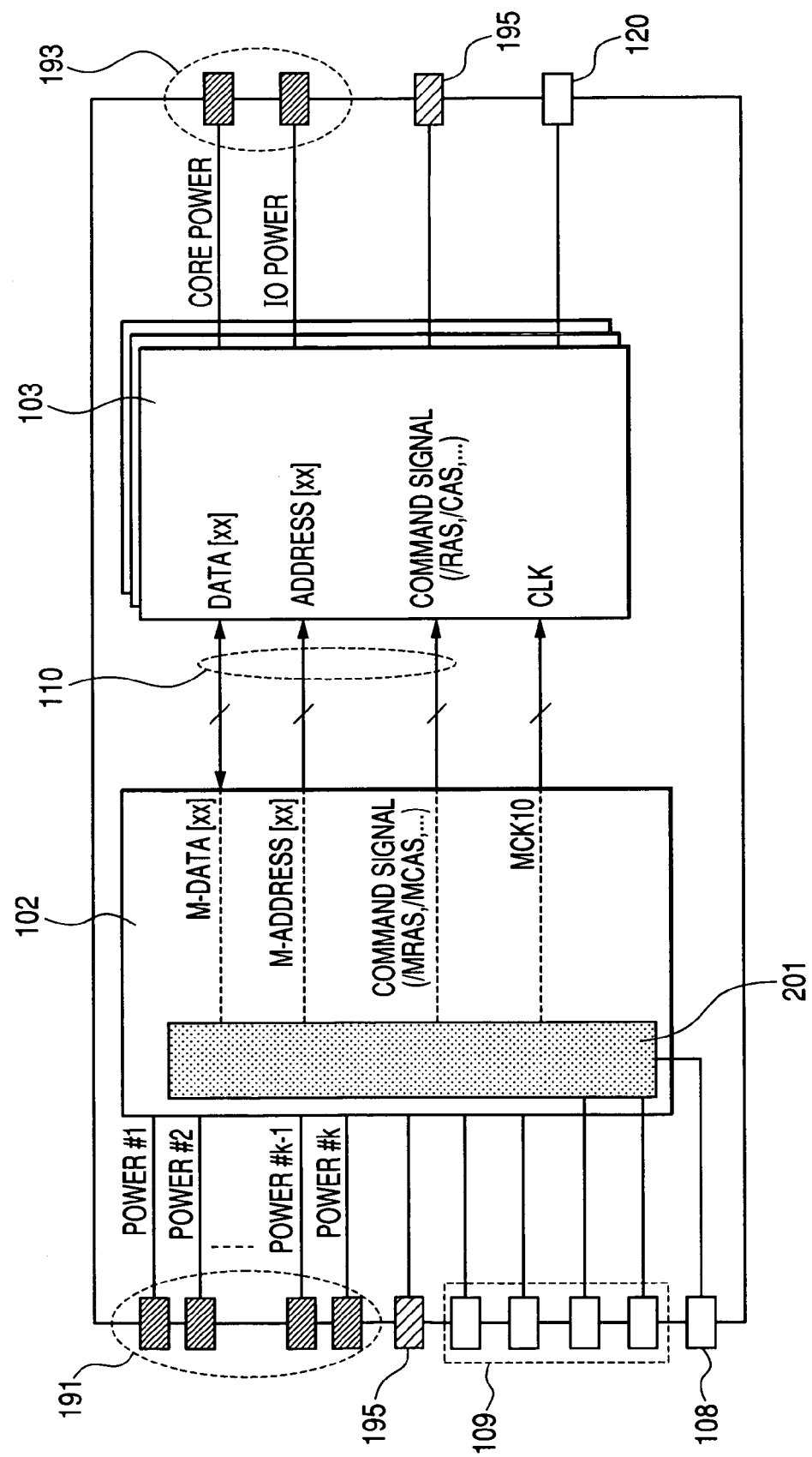
FIG. 5 is a block diagram showing the second embodiment of an MCP or SiP according to the present invention.

FIG. 4 is a front sectional view of a second embodiment, showing a mounting structure of another typical multichip package or system-in package according to the present invention. FIG. 5 is a block diagram showing the second embodiment of a multichip package or system-in package according to the present invention.

The second embodiment differs from the first embodiment in that a logic chip 102 includes, in a chip internal circuit, a test pattern generating circuit 201 which, for memory testing, generates a test pattern (i.e., an address signal, a data signal, and command signals such as /RAS and /CAS), thus enabling memory chip testing. Consequently, it is possible to make the test pattern generating circuit 201 valid within the logic chip 102 by giving a mode select signal ("High" or "Low" logical level signal or a rising/falling edge signal) from a mode select signal pin 108 or giving a test mode command signal from a logic signal pin 109. It is thus possible to test a memory chip(s) 103 by transmitting the test pattern (i.e., the address signal, the data signal, and the command signals) from the logic chip 102 via a memory IF circuit 107 to the memory chip(s) 103. For normal operating conditions, an interface between the logic chip 102 and the memory chip(s) 103 is formed through a route from the internal circuit of the logic chip 102 via the memory IF circuit 107.

In the second embodiment, during the memory tests conducted after the MCP or SiP 101 has been mounted, the memory chip(s) 103 can also be tested using the test pattern generating circuit 201 built into the logic chip 102. There is no need, therefore, to form a route to a test-only pin. For this reason, the memory control signals 110 to the memory chip(s) 103 need only to be connected between the logic chip 102 with the built-in test pattern generating circuit 201, and the memory chip(s) 103. Accordingly, if, as in the first embodiment, the MCP or SiP 101 includes one logic chip 102 and one memory chip 103, when the memory chip 103 is viewed from the logic chip 102, the memory control signals 110 take a one-for-one connection configuration free of branch wiring.

In addition, as shown in FIG. 4, the one-for-one wiring for the memory control signals 110 between the logic chip 102 and the memory chip 102 is conducted either by wire-bonding connection or bump connection (110b, 110c) via the wiring formed only on the first layer of the package substrate 104 or on the first and second layers thereof, or by direct wire-bonding connection or bump connection (110a).

If the MCP or SiP 101 includes one logic chip 102 and an "m" number of memory chips 103, when the memory chips 103 are viewed from the logic chip 102, the memory control signals 110 take a connection configuration based on a one-for-M or one-for-up-to-m branch wiring scheme. The memory control signal connection between the logic chip 102 and the memory chips 103, based on the one-for-M or one-for-up-to-m branch wiring scheme, becomes the direct connection (110a) by wire bonding between the logic chip 102 and the memory chips 103. Alternatively/additionally, the above connection of the memory control signals 110 becomes the wire-bonding connection or bump connection (110b, 110c) established via the wiring formed only on the first layer (signal wiring layer) of the package substrate 104 or on the first layer (signal wiring layer) and the second layer (GND wiring layer) [the wiring here may include one close to bumps].

As in the first embodiment, the above fact makes it unnecessary in the second embodiment that test-only pins for accessing a memory are routed from the surface of the package substrate 104 to the reverse side thereof. Therefore, area in which the various power supply wirings for the logic chip and the memory chips can be allocated on the third layer and/or next lower layer of the package substrate 104, is extended. Such extension, in turn, allows a necessary power supply wiring area to be obtained and substantially reduces supply voltage noise levels of the chips within the MCP or SiP 101. In addition, test-only pins which, to the memory control signals between the logic chip and the memory chips during actual operation, appears as if the wiring were unnecessary stub wiring, becomes unnecessary and deterioration of the memory control signals in waveform quality can be prevented. This makes it possible to realize an MCP or SiP that features low noise and high operational reliability.

Figure 6:
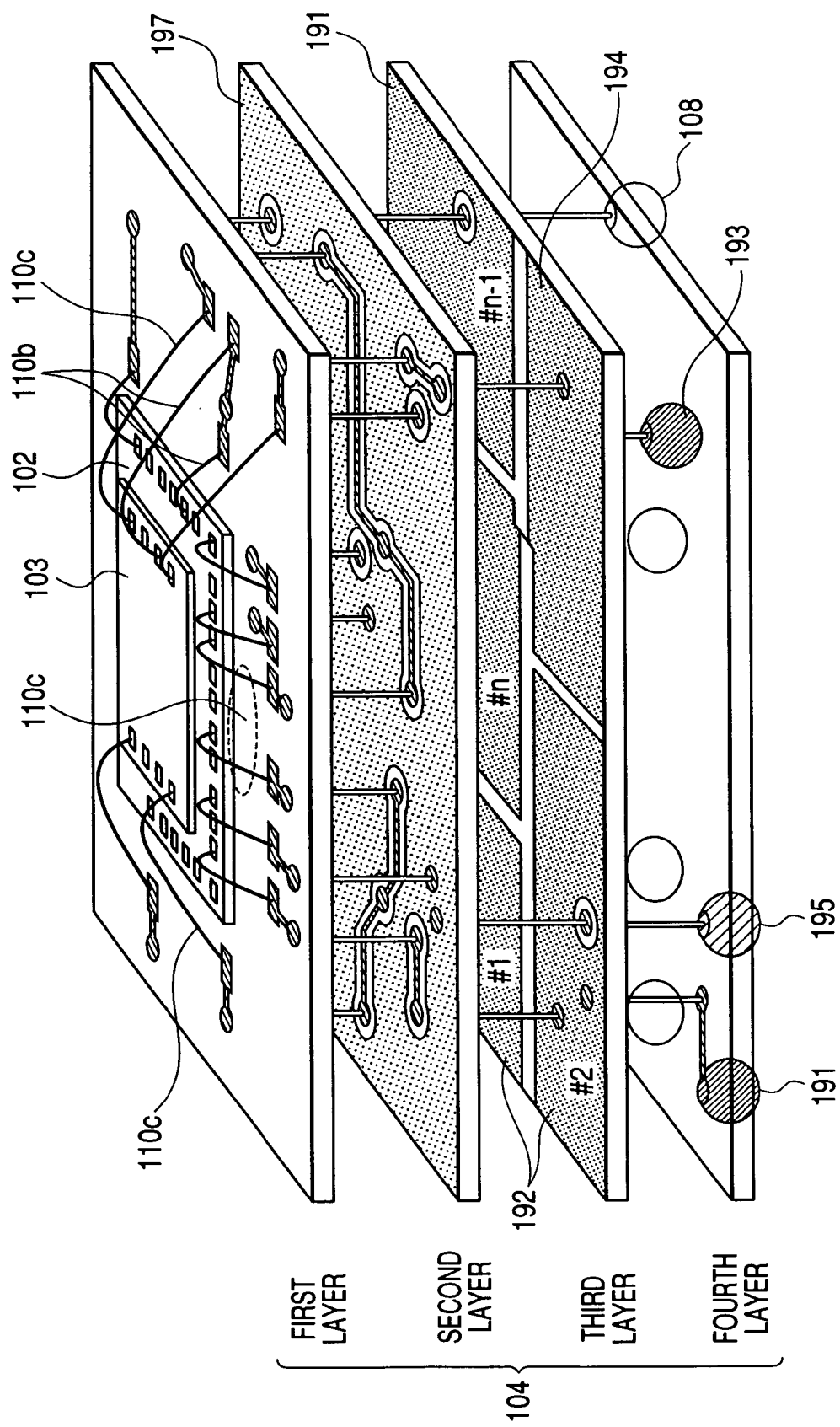
FIG. 6 is a stereographic perspective view showing the first and second embodiments of an MCP or SiP according to the present invention.

FIG. 6 is a view stereographically representing the first and second embodiments of the MCP/SiP according to the present invention. According to the first and second embodiments of the MCP/SiP according to the present invention, unnecessary test-only pins can be removed, which consequently allows a sufficient power supply wiring area for a logic chip and a memory chip(s) to be obtained on the third layer and/or next lower layer of a package substrate 104. Accordingly, it is possible to suppress supply voltage noise, and hence, the deterioration of signal waveform quality between logic chip 102 and memory chip(s) 103, and therefore to provide an MCP or SiP that is low in power supply noise level and high in operational reliability.

Needless to say, low noise and high operational reliability can be achieved in an MCP or SiP 101, even if this package includes one logic chip 102 and one or more ("m" number of) memory chips 103 and the memory control signals 110 existing when the memory chips 103 are viewed from the logic chip 102 are connected using a one-for-up-to-M branch wiring scheme.

It goes without saying that as in the first and second embodiments, an MCP/SiP of low noise and with high operational reliability can be supplied if the memory control signals 110 between the logic chip 102 and the memory chip(s) 103 are connected by wire-bonding connection or pad connection via a signal wiring layer (corresponding to the first layer) of the package substrate 104 or a GND wiring layer (corresponding to the second layer) thereof. If the number of layers on the package substrate 104 is increased to more than four, the number of signal wiring layers will also be increased.

In addition, it goes without saying that as in the first and second embodiments, an MCP/SiP of low noise and with high operational reliability can be supplied when the package substrate 104 has a layer structure with at least four layers (say, six or eight layers).

Figure 7:
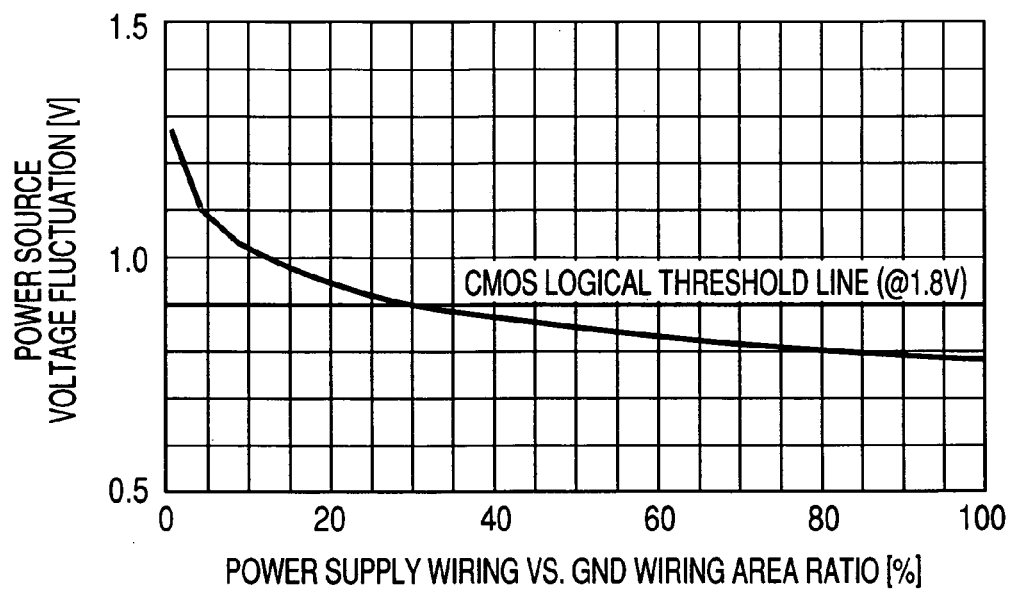
FIG. 7 is a diagram showing fluctuations in supply voltage in terms of power supply wiring area ratio with respect to a package area in the present invention.

Furthermore, in the MCP/SiP constructions of the first and second embodiments according to the present invention, if a total area of the logic chip power supply wirings 192 and memory chip power supply wirings 194 that are slit to vary in kind can be increased to at least 40% of an area of the package substrate 104 by dispensing with an unnecessary test-only pin which would otherwise need routing from the surface of the package substrate to the reverse side thereof, fluctuations in a supply voltage of the memory chip operating on 1.8-V power, for example, can be controlled below a logical threshold of 0.9 V, as shown in FIG. 7. The above relationship can be maintained, even if the number of power supply wiring layers is increased to two. Additionally, even if the number of memory chips is increased to two or more, since associated power supply wiring can be shared, the power supply wirings 194 for the memory chips does not need to be increased. It is desirable that the power supply wirings 192, 194 supply electric power to more than 10 kinds of logic chips and memory chips.

Figure 8:
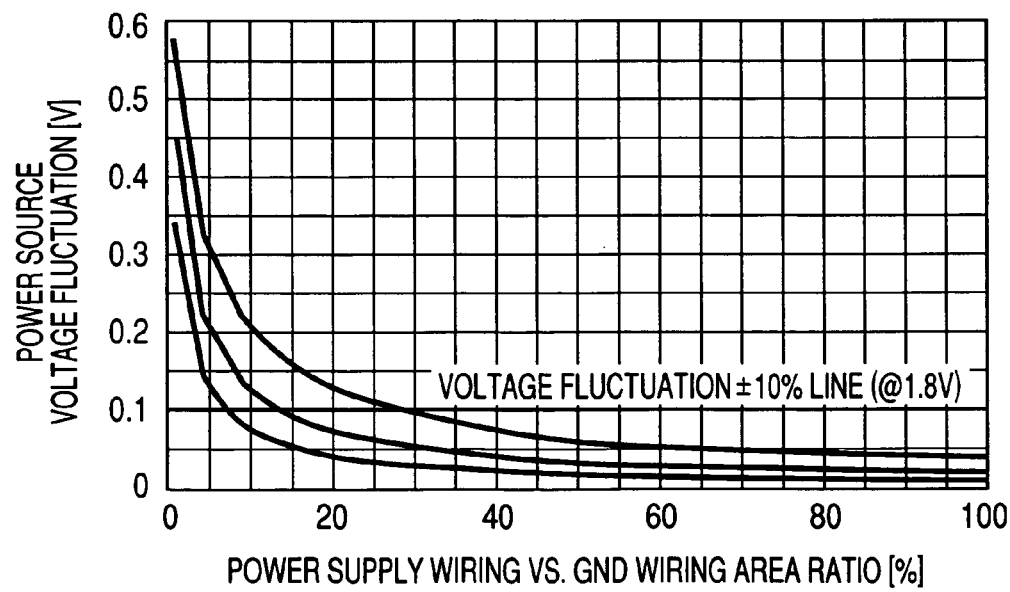
FIG. 8 is a diagram showing fluctuations in supply voltage in terms of power supply wiring area ratio with respect to a GND area in the present invention.

Moreover, if the total area of the logic chip power supply wirings 192 and memory chip power supply wirings 194 that are slit to vary in kind can be increased to at least 40% of an area of the GND wiring layer on, for example, the second layer of the package substrate 104 by dispensing with unnecessary test-only pins which will otherwise need routing from the surface of the package substrate to the reverse side thereof, fluctuations in the supply voltage of the memory chip operating on 1.8-V power can be controlled to stay within 10%, as shown in FIG. 8. Taking these measures makes it possible to provide an MCP/SiP that is even lower in noise level and even higher in operational reliability.

Finally, according to the present invention, use of the package substrate 104 that has no test-only pins enhances flexibility of BGA ball arrangement of the logic signal pins 109, test/logic signal combination pin 106, logic chip power supply pins 191, and memory chip power supply pins 193 in the MCP/SiP 101. More specifically, in the present invention, since there are no test-only pins in the package substrate 104, it is possible to arrange the logic chip power supply pins 191 and the memory chip power supply pins 193 all together at one section internal or external to the substrate 104 and thus to provide, by implementing stabilized supply of power, an MCP/SiP that is even lower in noise level and even higher in operational reliability.

What is claimed is:

1. A semiconductor package constructed by mounting, on a front surface of a package substrate, at least one memory chip and a logic chip for controlling the at least one memory chip, wherein:

the package substrate has four layers and a rear surface, a first pin is provided on the rear surface of the package substrate and electrically connected to the logic chip, a second pin is provided on the rear surface of the package substrate for transmitting a test signal and transmitting a logic signal, the logic chip includes a selector circuit which is configured to switch, in response to a test mode select signal, a signal path from a normal operation mode to a test mode which enables access from the second pin to a memory control signal to the at least one memory chip, the second pin transmits the test signal when the selector is in a test mode and transmits the logic signal when the selector circuit is in a normal operation mode, and power supply wiring for the logic chip and power supply wiring for the at least one memory chip are allocated to either the third layer of the package substrate or the third layer and next lower layer of the package substrate in the package substrate including at least four wiring layers, said allocated power supply wiring for the logic chip supplying electric power thereto by being connected from a power supply pin for the logic chip to thereto via the allocated power supply wiring for the logic chip, said allocated power supply wiring for the at least one memory chip supplying electric power to each thereof by being connected from power supply pins for the at least one memory chip to each thereof via the allocated power supply wiring for the at least one memory chip.

2. The semiconductor package according to claim 1, wherein the memory control signal connection uses a one-for-one wiring scheme or a one-for-up-to-m branch wiring scheme which includes:

a wire-bonding connection or bump connection established via wiring formed on a first layer, or on the first layer and a second layer of the package substrate including at least four wiring layers; or a direct wire-bonding connection or bump connection established between the logic chip the at least one memory chip.

3. The semiconductor package according to claim 2, wherein test-only pins, which are to directly access the at least one memory chip, are removed from the package substrate.

4. The semiconductor package according to claim 1, the memory control signal connection uses a one-for-one wiring scheme or a one-for-up-to-m branch wiring scheme which includes:

a wire-bonding connection or bump connection established via wiring formed on a signal wiring layer, or on the signal wiring layer and a GND wiring layer of the package substrate having at least four wiring layers; or a direct wire-bonding connection or bump connection established between the logic chip the at least one memory chip.

5. The semiconductor package according to claim 4, wherein test-only pins, which are to directly access the at least one memory chip, are removed from the package substrate.

6. The semiconductor package according to claim 1, wherein a total area of the allocated power supply wiring for the logic chip and the allocated power supply wiring for the at least one memory chip is at least 40% of an area of the package substrate.

7. The semiconductor package according to claim 1, wherein a total area of the allocated power supply wiring for the logic chip and the allocated power supply wiring for the at least one memory chip is at least 40% of a GND wiring area of the package substrate.

* * * * *